United States Patent
Raghavan et al.

[11] Patent Number: 6,086,953
[45] Date of Patent: *Jul. 11, 2000

[54] CERAMIC-COATED METAL GUIDE PIN

[76] Inventors: Srimathy Raghavan; Raghavan Krishnaswamy, both of 23 Overhill Rd., Ellington, Conn. 06029

[ * ] Notice: This patent is subject to a terminal disclaimer.

[21] Appl. No.: 09/267,869

[22] Filed: Mar. 12, 1999

Related U.S. Application Data

[63] Continuation-in-part of application No. 08/900,742, Jul. 25, 1997, Pat. No. 5,925,412
[60] Provisional application No. 60/051,490, Jul. 1, 1997.

[51] Int. Cl.⁷ .................................................. C23C 16/06
[52] U.S. Cl. ............................... 427/255.31; 427/255.34; 427/255.36; 427/255.7; 427/327; 427/419.2
[58] Field of Search .......................... 427/255.34, 255.36, 427/255.31, 255.391, 255.394, 255.7, 327, 419.2

[56] References Cited

U.S. PATENT DOCUMENTS

| | | |
|---|---|---|
| 4,020,316 | 4/1977 | Schaft et al. . |
| 4,789,768 | 12/1988 | Tobita et al. . |
| 5,259,675 | 11/1993 | Ichikawa et al. . |
| 5,516,588 | 5/1996 | van den Berg et al. ............... 428/469 |
| 5,958,569 | 9/1999 | Leverenz et al. ........................ 428/216 |

*Primary Examiner*—Roy V. King
*Attorney, Agent, or Firm*—Cantor Colburn LLP

[57] ABSTRACT

A method for manufacturing a guide pin is disclosed, which comprises machining a metal substrate core; optionally depositing an intermediate coating onto the substrate core; and depositing an insulative ceramic coating onto the intermediate coating by a chemical vapor deposition process under pressure conditions of up to about 500 torr, wherein the Rockwell C hardness of the metal core is greater than or equal to about 45, and the surface roughness values of the as-deposited coating are Ra less than or equal to about 35 microinches and Rmax less than or equal to about 250 microinches.

21 Claims, 6 Drawing Sheets

675X

CERAMIC-COATED METAL GUIDE PIN

CROSS REFERENCE TO RELATED APPLICATION

This application is a continuation-in-part of U.S. Ser. No. 08/900,742, filed Jul. 25, 1997, now U.S. Pat. No. 5,925,412, which claims priority to Provisional Application No. 60/051,490, entitled filed Jul. 1, 1997, "AN IMPROVED CERAMIC-COATED GUIDE PIN", filed on Jul. 1, 1997, both of which are incorporated by reference herein in their entireties.

FIELD OF THE INVENTION

The present invention relates to the art of resistance welding. More particularly, it relates to the art of nut welding. Even more specifically, the present invention relates to a ceramic-coated metal guide pin and methods of manufacture of guide pins used to guide the nut during nut welding. The guide pins are low cost, with high core hardness and high surface wear resistance.

BACKGROUND ART

Resistance welding is a method of joining metals together by making use of heat developed by an electric current, the metals being part of the electrical circuit. Resistance welding techniques are often used to attach small parts, such as nuts, to larger bases, such as sheet metal, and have been described, for example, in U.S. Pat. No. 4,020,316 to Schaft et al. and U.S. Pat. No. 4,789,768 to Tobita et al. The base is located between a pair of relatively movable welding electrodes, one of which has a retractable guide pin that holds the nut. The guide pin is then depressed so that the nut comes into contact with the face of the opposite electrode. Welding current is then passed through the nut and the base to weld the nut to the base. The guide pin holding the nut in place accordingly should be electrically insulated, in order to prevent arcing between the nut and the guide pin. The guide pin must also possess excellent wear resistance characteristics and sufficient mechanical strength to prevent chipping and breaking.

Prior art guide pins comprise metallic cores insulated by an alumina ($Al_2O_3$), titania ($TiO_2$), or an alumina-titania coating. Such coatings have been formed by an oxidizing heat treatment or by flame spraying. These types of guide pins have several disadvantages. For example, they exhibit low overall core hardness and hence low toughness and mechanical strength. The insulation films, especially those formed by flame spray coating, peel and chip easily due to poor bonding to the substrate, and thus results in pins that must be replaced often. The relatively low insulation film hardness results in poor wear resistance, and the inherently high levels of porosity result in deterioration of the film strength. The high surface roughness of these pins also results in poor nut slidability.

In response to the above drawbacks and disadvantages, all-ceramic pins have been developed such as set forth in U.S. Pat. No. 5,259,675 to Ichikawa et al. This patent discloses an all-ceramic guide pin having at least some surfaces that are microscopically gently curved, in order to improve nut slidability. Such all-ceramic pins are more expensive to manufacture compared with metallic pins (originally about twenty times more expensive) and those manufactured in accordance with Ichikawa et al. as above are still about two to four times more expensive than metallic pins, thereby making them impractical. Another major disadvantage of all-ceramic pins is the inherent brittleness of the ceramics used in their manufacture.

Accordingly, there remains a need for inexpensive, insulated guide pins with a high level of core hardness and thus high toughness and mechanical strength. The insulative coating or film should be tenaciously well bonded to the substrate and possess high hardness, and thus exhibit excellent wear resistance. In addition, the insulating surface needs to be smooth to facilitate nut slidability.

SUMMARY OF THE INVENTION

The above-described drawbacks and deficiencies of the prior art are alleviated by the guide pin and method of manufacture of the present invention, wherein the guide pin comprises a metal core and a generally smooth, non-porous insulative ceramic layer disposed on the metal core. In a particularly preferred embodiment of the present invention, an intermediate layer comprising titanium-carbonitride (TiCN) is disposed on the metal core, thereby improving bonding of the ceramic layer to the guide pin assembly. In an important feature of the invention, the insulative layer is generally nonporous and has high hardness, and thus exhibits excellent wear resistance. In accordance with the method of manufacture of the present invention, the intermediate and insulative layers are deposited by a chemical vapor deposition process known as the "Bernex" process that results in a very hard, generally nonporous coating. In an alternate embodiment, the insulative layers are deposited by a chemical vapor deposition process under vacuum.

The guide pins manufactured in accordance with the present invention provide a high level of core toughness. The generally nonporous coating has a high hardness, and maintains its strength over extended usage without chipping or film exfoliation. It is also relatively inexpensive to produce. The above-discussed and other features and advantages of the present invention will be appreciated and understood by those skilled in the art from the following detailed description and drawings.

DETAILED DESCRIPTION OF THE INVENTION

Figure 1:
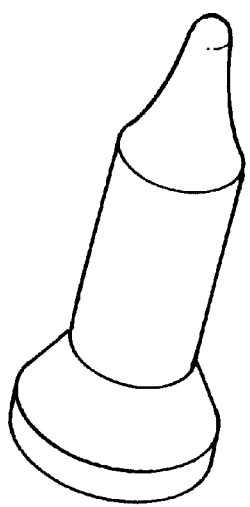
FIG. 1 is a schematic perspective view of a guide pin.
Figure 2:
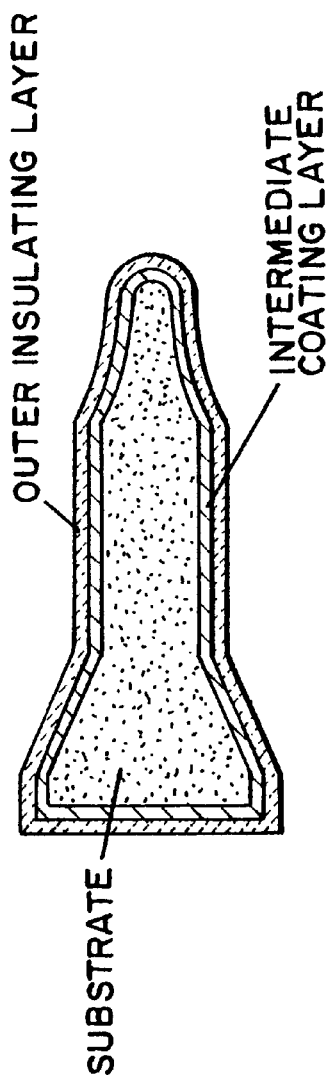
FIG. 2 is a schematic sectional view of a guide pin comprising the intermediate and insulative coating layers in accordance with the present invention.

The guide pin in accordance with the present invention comprises a metal core and a smooth, generally non-porous insulative ceramic layer disposed on the metal core. In a particularly preferred embodiment of the present invention, an intermediate layer is disposed on the metal core, thereby improving bonding of the ceramic layer to the guide pin assembly. Preferably, the core is D-2 tool steel, the insulative coating comprises aluminum oxide, and the intermediate layer comprises titanium-carbonitride. In an important feature of the present invention, the intermediate and ceramic layers are deposited by a chemical vapor deposition process, the Bernex process, which provides a generally nonporous insulative layer. The generally nonporous nature and high hardness of the insulative layer results in enhanced physical properties relative to prior art ceramic-coated guide pins. In an alternate embodiment, a chemical vapor deposition process conducted under vacuum is provided, which results in an insulative layer having a small grain microstructure and enhanced physical properties relative to prior art ceramic-coated guide pins. In the vacuum chemical vapor deposition process, the chemical vapor deposition is conducted under reduced pressure conditions typically up to about 500 torrs, preferably up to about 300 torrs, and most preferably up to about 230 torrs.

Preferably, the metal core (substrate material) comprises a tough metal with high mechanical strength. Proper choice of substrate material is very critical, since this material dictates the mechanical characteristics of the guide pin, as well as the chemical compatibility characteristics with the coating materials used. The substrate material must also be readily machinable, amenable to producing a good surface finish. In addition, during coating application, as described further below, D-2 tool steel maintains a high level of dimensional stability, thereby eliminating expansion and spalling problems. Accordingly, suitable materials known in the art include but are not limited to those in the high carbon-high chromium tool steel family. A particularly preferred material is AISI - D2 tool steel. This material has a nominal chemical composition of 1.5% carbon, 1.00% molybdenum, 12.00% chromium, 1.00% vanadium, with the balance being iron.

The required finished dimensions of the metal core must take into account the bonding and insulative coating layers. For example, the total coating thickness of both layers may be nominally set at 0.0005" to 0.001" per side (0.001" to 0.002" on a diameter). Hence if the final required diameter is 0.264"–0.268", then the subject diameter needs to be machined to 0.264"–0.266" to be within the final required dimensions, because after adding coating, the finished dimensions are as follows:

based on 0.005" per side: 0.264"+0.001"=0.265" to 0.266"+0.001"=0.267"

based on 0.001" per side: 0.264"+0.002"=0.266" to 0.266"+0.002"=0.268"

thus meeting the required finished dimensions. Once the desired machining dimensions have been obtained from the final required finished dimensions, the raw bar stock is machined so as to produce pins having a surface finish of Ra=30 microinches or better. This level of surface finish is obtainable using carbide inserts during machining.

After machining, the metal substrate is coated using chemical vapor deposition. In chemical vapor deposition, chemical vapors of the desired coating composition are generated in a reactor vessel and allowed to contact the metal substrate, such vapors forming the desired coating on the substrate.

In order to form a tenaciously well bonded insulative layer, an intermediate layer between the metallic substrate and the insulating outer coating is preferred. Materials suitable for use as a bonding layer include but are not limited to those known in the art such as titanium-nitride, titanium carbonitride, and the like. The preferred intermediate coating layer is titanium-carbonitride.

Materials suitable for use as an insulative layer include but are not limited to those known in the art such as zirconium oxide, aluminum oxide, and the like. The preferred insulative layer comprises aluminum oxide, and is characterized by having an average surface roughness value (Ra) of approximately 35 microinches, a maximum surface roughness value (Rmax) of approximately 250 microinches. Having a high surface hardness provides the requisite wear resistance, while having a high core hardness provides the requisite mechanical strength.

Importantly, the deposition process used in accordance with the present invention must be capable of forming a film having an Ra of about 35 microinches and an Rmax of about 250 microinches. These surface characteristics result in excellent nut slidability. The process must also result in a coated metal substrate having a core hardness of greater than or equal to 45 Rockwell C, in order to provide the requisite wear resistance. One process capable of providing finished guide pins having these characteristics is the "Bernex" process, as practiced by Sylvester & Co., Beachwood, Ohio, U.S.A. The Bernex process utilizes a proprietary set of parameters for CVD developed by Sylvester & Co., said set of parameters being provided upon request to purchasers of CVD equipment from Sylvester & Co.

In another embodiment of the present invention, a non-Bernex chemical vapor deposition process is conducted under reduced pressure conditions. Preferably, the chemical vapor deposition process is conducted under reduced pressure conditions of up to about 500 torrs. More preferably, the chemical vapor deposition process is conducted under reduced pressure conditions of up to about 300 torrs. Most preferably, the chemical vapor deposition process is conducted under reduced pressure conditions of up to about 250 torrs.

The two-layer titanium-carbonitride/aluminum oxide D-2 tool steel guide pin of this invention possesses significant advantages over previously used guide pins in that it has a high level of core hardness and thus exhibits high toughness and mechanical strength. The coatings manufactured by the method of the present invention provides a tenaciously well-bonded insulating aluminum oxide coating that exhibits very little porosity and excellent nut slidability. The preferred intermediate bonding layer eliminates chipping and film exfoliation problems. Coating hardness is also very high, thereby yielding excellent wear resistance. This method of manufacture is relatively inexpensive and hence can be easily adapted to commercial use.

The invention is further described using the following non-limiting comparative examples, based on a prior art metal guide pin wherein the coating is formed by an oxidizing heat treatment (Sample K07, known as KCF), a ceramic-coated metal guide pin wherein the ceramic coating is deposited using a non-Bernex chemical vapor deposition process (Sample M06) not performed under reduced pressure conditions, and a ceramic-coated metal guide pin in accordance with the present invention (Sample S08) using the Bernex process. Sample S08 comprises an AlSl-D2 tool steel substrate, an intermediate titanium-carbonitride coating having a thickness of approximately 10 microns, and an alumina insulative coating, wherein the total thickness is approximately 15 microns. The coatings were deposited by Sylvester & Co. using the Bernex process.

Figure 3:
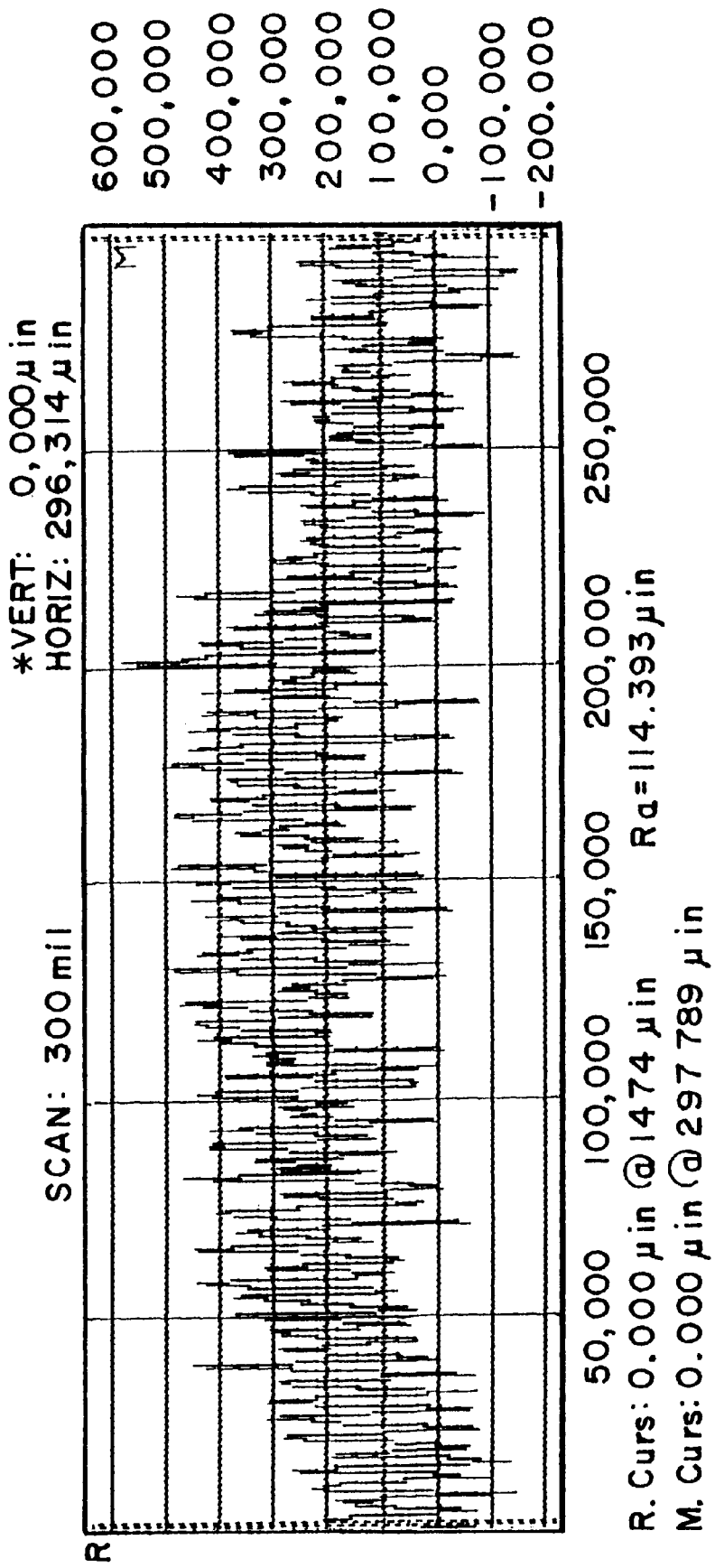
FIG. 3 is a surface roughness profile of a guide pin (Sample M06) manufactured using a non-Bernex chemical vapor deposition process not performed under reduced pressure conditions.
Figure 4:
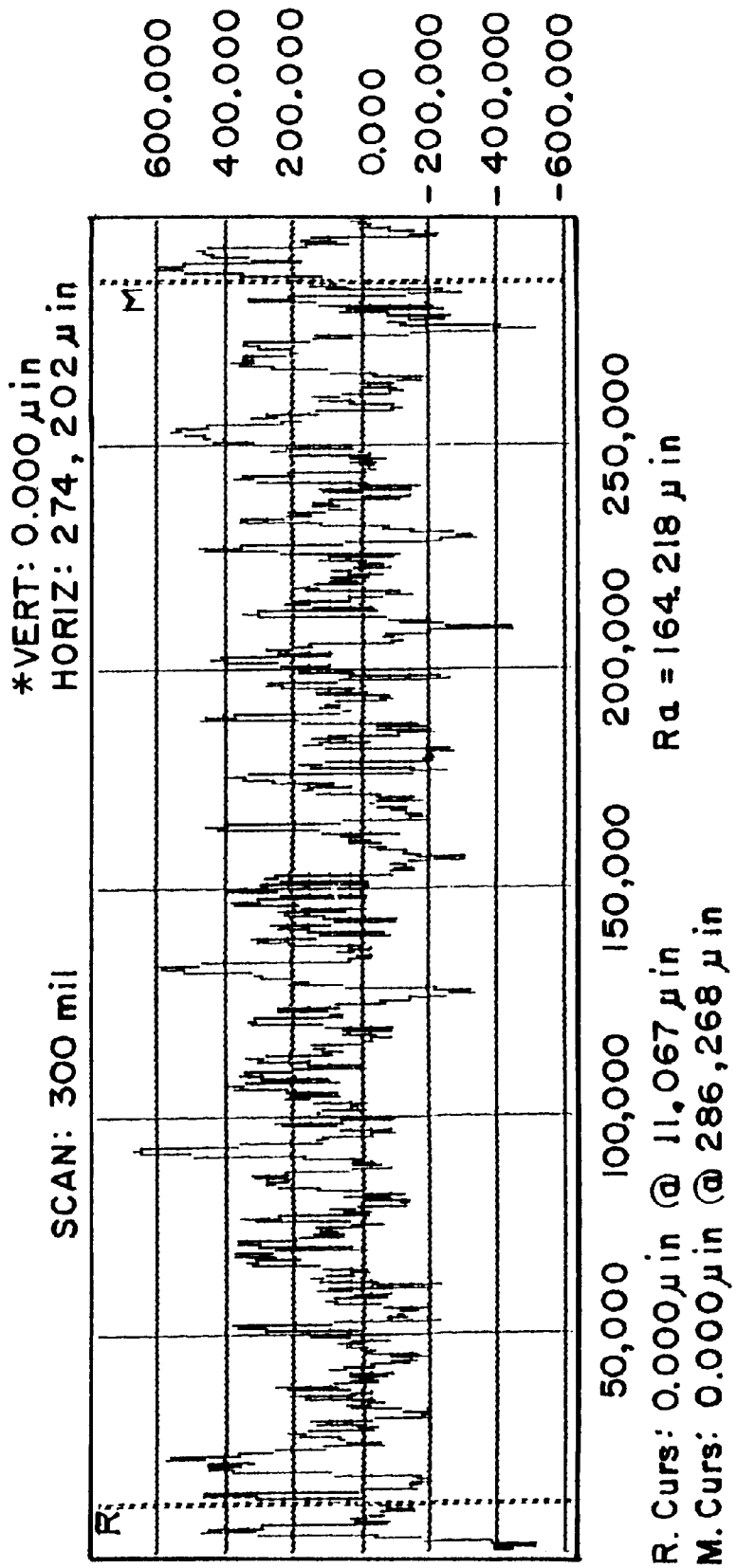
FIG. 4 is a surface roughness profile of a prior art metal guide pin (Sample K07, known as KCF) manufactured by oxidative heat treatment.
Figure 5:
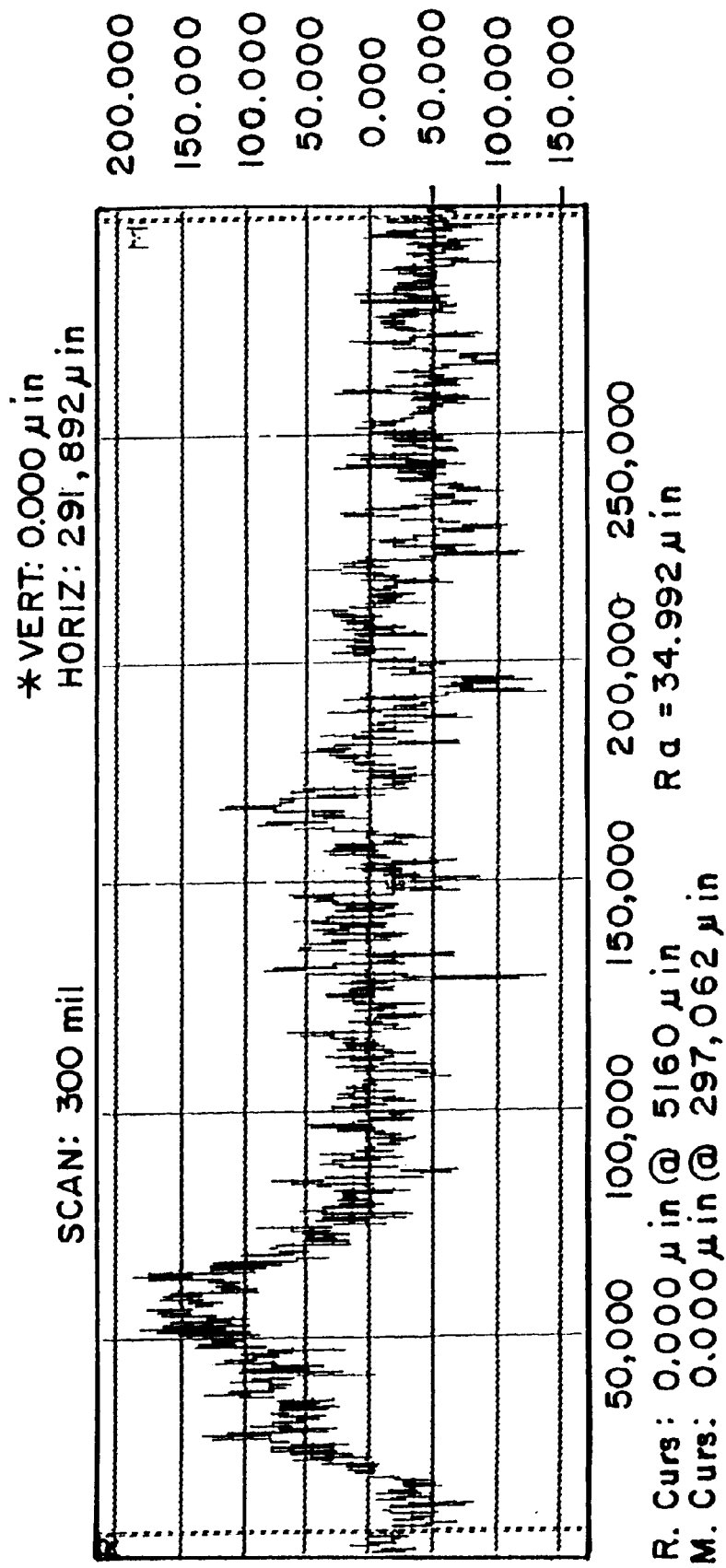
FIG. 5 is a surface roughness profile of a guide pin (Sample S08) manufactured in accordance with the present invention.

Profilometer measurements (surface roughness profiles) of the above guide pins were performed using a Sloan Dektak 3030 (calibrated against a NIST traceable 1000 angstrom standard [MRS-3]), based on a linear trace 0.3 inches long on the barrel section of each sample. The surface roughness profiles for samples M06, K07, and S08 are shown in FIGS. 3, 4, and 5, respectively. Average and maximum roughness values are reported in the Table below in microinches.

| Sample | Ra | Rmax |
|--------|-------|------|
| M06 | 114.4 | 506 |
| K07 | 154.2 | 846 |
| S08 | 35 | 186 |

Figure 6:
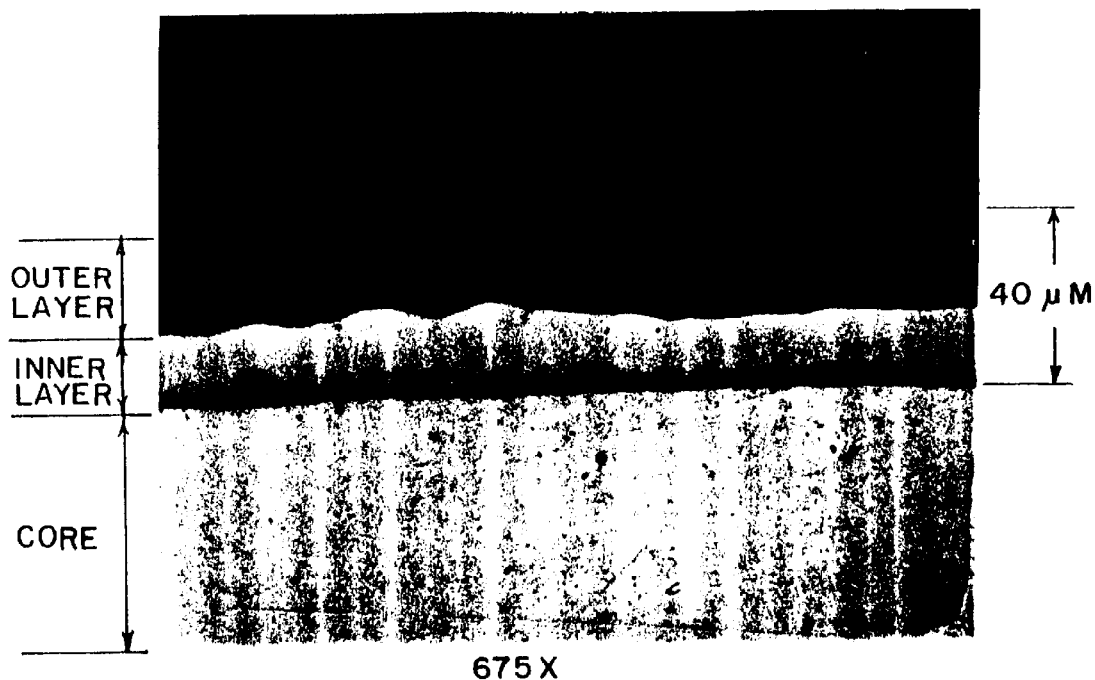
FIG. 6 is a microphotograph of a cross-section of a guide pin (Sample M06) manufactured using a non-Bernex chemical vapor deposition process not performed under reduced pressure conditions.
Figure 7:
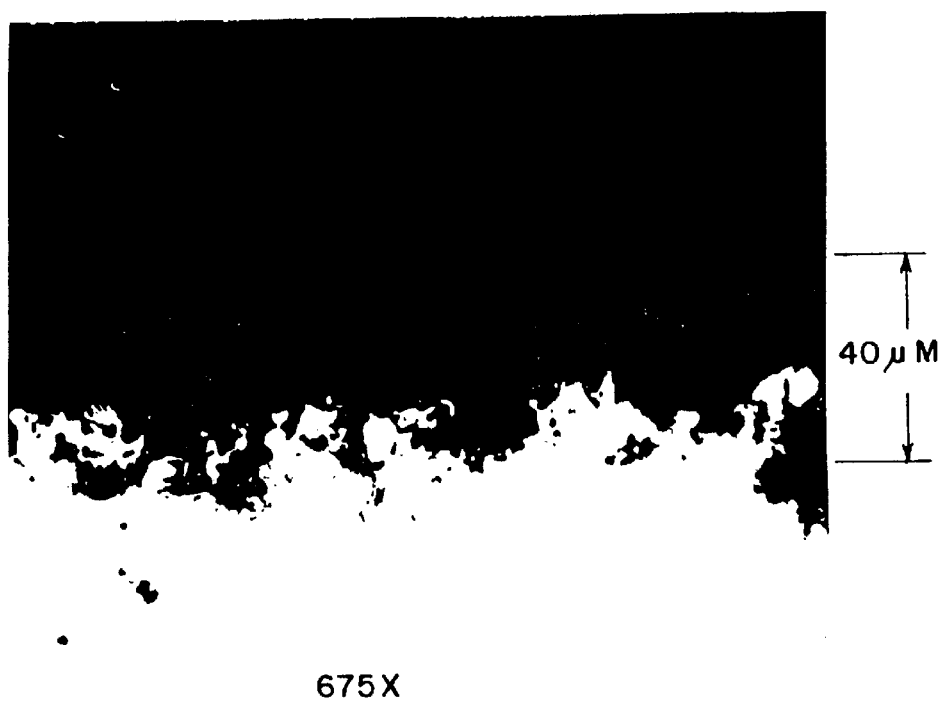
FIG. 7 is a microphotograph of a cross-section of a prior art metal guide pin (Sample K07 known as KCF) manufactured by oxidative heat treatment.
Figure 8:
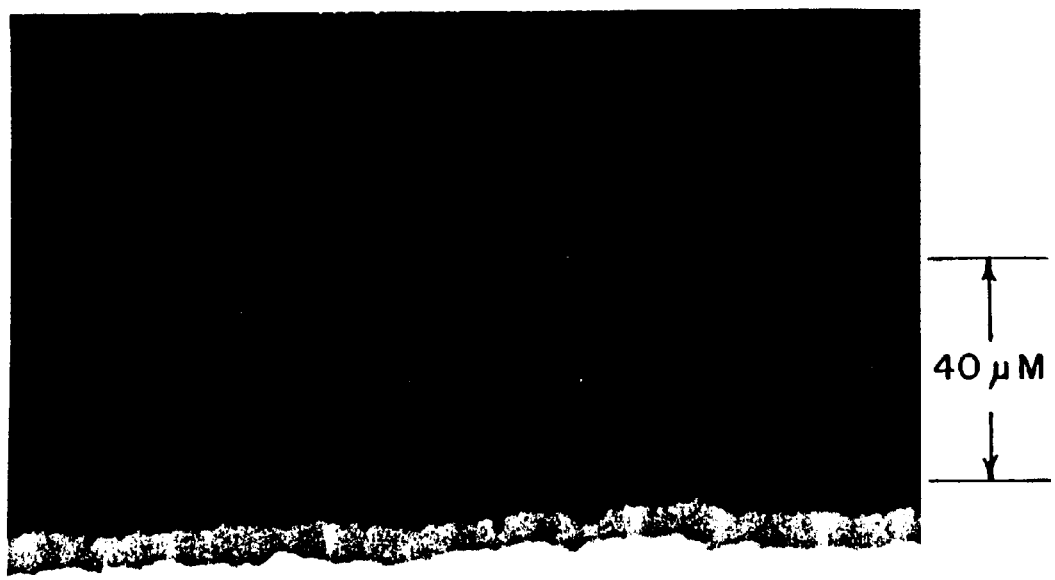
FIG. 8 is a microphotograph of a cross-section of a guide pin (Sample S08) manufactured in accordance with the present invention.

The microphotograph shown in FIG. 8 further supports the decreased surface roughness and non-porous nature of the ceramic-coated metal guide pin manufactured by the Bernex process. FIGS. 6 and 8 show the presence of two layers in the ceramic coating, while FIG. 7 exhibits a highly irregular, multi-phase, non-homogenous coating which deeply infiltrates the core metal grain boundaries.

Vickers micro-hardness measurements were performed at locations in the core material and each coating layer. Three measurements were taken at each location and averaged to obtain the final hardness values. Most measurements were made under a 233.5 gram-force load, except for the M06 sample, which could only be tested under a 61.3 gram-force load. A single additional correlation indent was taken on the coating layer of the K07 sample to show consistency of the measurement between the two different loads. The micro-indenter was calibrated to an NIST standard block (SRM 1896) with a Vickers hardness of 533.2. Results are shown in the Table below:

| Sample | Core Hardness | Outer Layer Hardness |
|--------|---------------|----------------------|
| M06 | Rc 37 | 1573 Vickers |
| K07 | less than Rc 20 | 518 Vickers |
| S08 | Rc 55 | 2342 Vickers |

It should be noted that the Vickers reading over 1,000 is outside the normal range of hardness measured by this technique. However, while the readings may not be used for measures of absolute hardness, they can still be used to compare relative differences between the samples. In this case, the data shows the superiority of the ceramic films in accordance with the present invention, while maintaining high levels of core toughness. As it may be seen, the core hardness of the non-Bernex, non-reduced pressure processed sample is significantly lower.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method for manufacturing a guide pin, comprising
   machining a metal substrate core;
   depositing an intermediate coating onto the substrate core; and
   depositing an insulative ceramic coating onto the intermediate coating by a chemical vapor deposition process under pressure conditions of up to about 500 torrs, wherein the Rockwell C hardness of the metal core is greater than or equal to about 45, and the surface roughness values of the as-deposited coating are Ra less than or equal to about 35 microinches and Rmax less than or equal to about 250 microinches.

2. The method as set forth in claim 1, wherein
   the chemical vapor deposition process is conducted under pressure of up to about 300 torrs.

3. The method as set forth in claim 2, wherein
   the chemical vapor deposition process is conducted under pressure of up to about 250 torrs.

4. The method as set forth in claim 1, wherein
   the metal substrate core comprises a high carbon-high chromium tool steel or a D-2 tool steel.

5. The method as set forth in claim 1, wherein
   the ceramic coating comprises aluminum oxide or zirconium oxide.

6. The method as set forth in claim 1, wherein
   the chemical vapor deposition process is conducted under pressure of up to about 250 torrs;
   the metal substrate core comprises a high carbon-high chromium tool steel or a D-2 tool steel; and
   the ceramic coating comprises aluminum oxide or zirconium oxide.

7. A method for manufacturing a guide pin, comprising
   machining a metal substrate core; and
   depositing an insulative ceramic coating onto the substrate core by a chemical vapor deposition process under pressure conditions of up to about 500 torrs, wherein the Rockwell C hardness of the metal core is greater than or equal to about 45, and the surface roughness values of the as-deposited coating are Ra less than or equal to about 35 microinches and Rmax less than or equal to about 250 microinches.

8. The method as set forth in claim 7, wherein
   the chemical vapor deposition process is conducted under pressure of up to about 300 torrs.

9. The method as set forth in claim 8, wherein
   the chemical vapor deposition process is conducted under pressure of up to about 250 torrs.

10. The method as set forth in claim 7, further comprising
    depositing an intermediate coating between the substrate and the insulative coating.

11. The method as set forth in claim 10, wherein
    the intermediate coating comprises titanium carbonitride or titanium nitride.

12. The method as set forth in claim 7, wherein
    the metal substrate core comprises a high carbon-high chromium tool steel or a D-2 tool steel.

13. The method as set forth in claim 7, wherein
    the ceramic coating comprises aluminum oxide or zirconium oxide.

14. The method as set forth in claim 11, wherein
    the chemical vapor deposition process is conducted under pressure of up to about 250 torrs; and
    the metal substrate core comprises a high carbon-high chromium tool steel or a D-2 tool steel.

15. A method of manufacturing a guide pin, comprising
    depositing an insulative ceramic coating on a machined metal substrate core by a chemical vapor deposition process under pressure conditions of up to about 500 torrs, wherein the Rockwell C hardness of the metal core is greater than or equal to about 45, and the surface roughness values of the as-deposited coating are Ra less than or equal to about 35 microinches and Rmax less than or equal to about 250 microinches.

16. The method as set forth in claim 15, wherein the metal substrate comprises a high carbon-high chromium tool steel or a D-2 tool steel, and the ceramic coating comprises aluminum oxide or zirconium oxide.

17. The method as set forth in claim 15, further comprising depositing an intermediate coating on the metal substrate core prior to depositing the insulative ceramic coating.

18. The method as set forth in claim 17, wherein the intermediate coating comprises titanium carbonitride or titanium nitride.

19. The method as set forth in claim 15, wherein the chemical vapor deposition process is conducted under pressure of up to about 300 torrs.

20. The method as set forth in claim 15, wherein the chemical vapor deposition process is conducted under pressure of up to about 250 torrs.

21. The method as set forth in claim 20, further comprising depositing an intermediate coating between the substrate and the insulative coating; wherein the intermediate coating comprises titanium carbonitride or titanium nitride; wherein;

the metal substrate core comprises a high carbon-high chromium tool steel or a D-2 tool steel; and the ceramic coating comprises aluminum oxide or zirconium oxide.

* * * * *

UNITED STATES PATENT AND TRADEMARK OFFICE
CERTIFICATE OF CORRECTION

PATENT NO. : 6,086,953
DATED : July 11, 2000
INVENTOR(S) : Srimathy Raghavan et al.

It is certified that error appears in the above-identified patent and that said Letters Patent is hereby corrected as shown below:

Column 1,
Line 9, after "entitled" delete "filed July. 1, 1997,"

Column 3,
Line 51, after "side" delete "0.264" + 0.002" = 0.266" and insert therefor -- 0.264" + 0.002 = 0.266" --

Column 7,
Line 4, after "substrate" insert -- core --

Signed and Sealed this

Sixteenth Day of March, 2004

JON W. DUDAS
*Acting Director of the United States Patent and Trademark Office*